(12) United States Patent
Shibasaki et al.

(10) Patent No.: US 9,853,175 B2
(45) Date of Patent: Dec. 26, 2017

(54) SOLAR CELL MODULE

(71) Applicant: Kabushiki Kaisha Toshiba, Minato-ku (JP)

(72) Inventors: Soichiro Shibasaki, Nerima (JP); Hiroshi Ohno, Yokohama (JP); Kazushige Yamamoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 23 days.

(21) Appl. No.: 14/855,741

(22) Filed: Sep. 16, 2015

(65) Prior Publication Data

US 2016/0087136 A1    Mar. 24, 2016

(30) Foreign Application Priority Data

Sep. 22, 2014  (JP) ................. 2014-192254

(51) Int. Cl.
*H01L 31/042* (2014.01)
*H01L 31/054* (2014.01)
(Continued)

(52) U.S. Cl.
CPC .... *H01L 31/0547* (2014.12); *H01L 31/02168* (2013.01); *H01L 31/042* (2013.01);
(Continued)

(58) Field of Classification Search
CPC .............. H01L 31/0547; H01L 31/02168; H02S 40/20
See application file for complete search history.

(56) References Cited

U.S. PATENT DOCUMENTS

| | | | |
|---|---|---|---|
| 4,964,713 | A | 10/1990 | Goetzberger |
| 2001/0008144 | A1 | 7/2001 | Uematsu et al. |

(Continued)

FOREIGN PATENT DOCUMENTS

| | | |
|---|---|---|
| AU | 2009230775 B1 | 3/2010 |
| DE | 199 07 506 A1 | 9/1999 |

(Continued)

OTHER PUBLICATIONS

Extended European search report issued Jan. 27, 2016 in Patent Application No. 15185425.4.

*Primary Examiner* — Shannon Gardner
(74) *Attorney, Agent, or Firm* — Oblon, McClelland, Maier & Neustadt, L.L.P.

(57) ABSTRACT

According to one embodiment, a solar cell module includes a solar cell panel and a concentrator. The solar cell panel includes a solar cell. The concentrator reflects light incident from the outside and irradiates the light onto the solar cell. The concentrator has a first surface and a second surface. The first surface reflects light incident at a first incident angle and irradiates the light incident at the first incident angle onto a first portion within the area of the solar cell. The second surface reflects light incident at a second incident angle and irradiates the light incident at the second incident angle onto a second portion within the area of the solar cell. The second incident angle is different from the first incident angle. The second portion is different from the first portion. The first surface and the second surface are asymmetric as viewed from the solar cell.

14 Claims, 14 Drawing Sheets

(51) Int. Cl.
  *H01L 31/0216* (2014.01)
  *H02S 40/22* (2014.01)
  *H02S 40/20* (2014.01)

(52) U.S. Cl.
  CPC .............. *H02S 40/20* (2014.12); *H02S 40/22* (2014.12); *Y02B 10/12* (2013.01); *Y02E 10/52* (2013.01)

(56) References Cited

U.S. PATENT DOCUMENTS

| | | | |
|---|---|---|---|
| 2005/0081909 | A1 | 4/2005 | Paull |
| 2009/0032102 | A1* | 2/2009 | Chen .................... F24J 2/067 |
| | | | 136/259 |
| 2010/0024868 | A1 | 2/2010 | Baruchi et al. |
| 2011/0094564 | A1 | 4/2011 | McCall |
| 2011/0203574 | A1 | 8/2011 | Harding |
| 2011/0209743 | A1 | 9/2011 | Clive |
| 2011/0214738 | A1 | 9/2011 | Halahmi et al. |
| 2016/0087136 | A1 | 3/2016 | Shibasaki et al. |

FOREIGN PATENT DOCUMENTS

| | | |
|---|---|---|
| JP | 2-502500 A | 8/1990 |
| JP | 5-61786 B2 | 9/1993 |
| JP | 6-37344 A | 2/1994 |
| JP | 8-330619 A | 12/1996 |
| JP | 10-303448 A | 11/1998 |
| JP | 2001-77399 A | 3/2001 |
| JP | 2001-189487 A | 7/2001 |
| JP | 2002-219094 A | 8/2002 |
| JP | 2006-269523 A | 10/2006 |
| JP | 2006-343435 A | 12/2006 |
| JP | 2010-134131 | 6/2010 |
| JP | 2010-169981 | 8/2010 |
| JP | 2012-502458 A | 1/2012 |
| JP | 2012-69973 | 4/2012 |
| JP | 2016-63172 A | 4/2016 |
| WO | WO 2008/072224 A2 | 6/2008 |
| WO | WO 2008/072224 A3 | 6/2008 |
| WO | WO 2010/032095 A2 | 3/2010 |
| WO | WO2010/032095 A3 | 3/2010 |
| WO | WO 2010/055507 A2 | 5/2010 |
| WO | WO 2010/055507 A3 | 5/2010 |
| WO | WO 2011/038450 A1 | 4/2011 |

* cited by examiner

SOLAR CELL MODULE

CROSS-REFERENCE TO RELATED APPLICATIONS

This application is based upon and claims the benefit of priority from Japanese Patent Application No. 2014-192254, filed on Sep. 22, 2014; the entire contents of which are incorporated herein by reference.

FIELD

Embodiments described herein relate generally to a solar cell module.

BACKGROUND

Research and development of solar cell modules are being performed. When light is directly incident on a solar cell panel of a solar cell module, that is, when concentration of the light is not performed, the solar cell panel can absorb light from a relatively wide range of angles; but the solar cell panel must have a relatively wide surface area. Therefore, the solar cell module is expensive.

There is a possibility that the cost per surface area of the solar cell module can be reduced by combining the solar cell panel with an inexpensive concentrator. A condensing lens, a concentrator called a CPC (Compound Parabolic Concentrator), etc., may be used as technology for combining the concentrator and the solar cell panel. However, when the condensing lens or the CPC is used in the solar cell module, a drive device becomes necessary to drive the solar cell panel to follow the sun because the orientation of the light of the sun changes according to the season, the time, etc. Therefore, the solar cell module is expensive.

There is a possibility that the cost per surface area of the solar cell module can be reduced by reducing the surface area of the solar cell panel. To reduce the surface area of the solar cell panel, it is desirable to improve the concentration ratio of the solar cell module.

DETAILED DESCRIPTION

Figure 1:
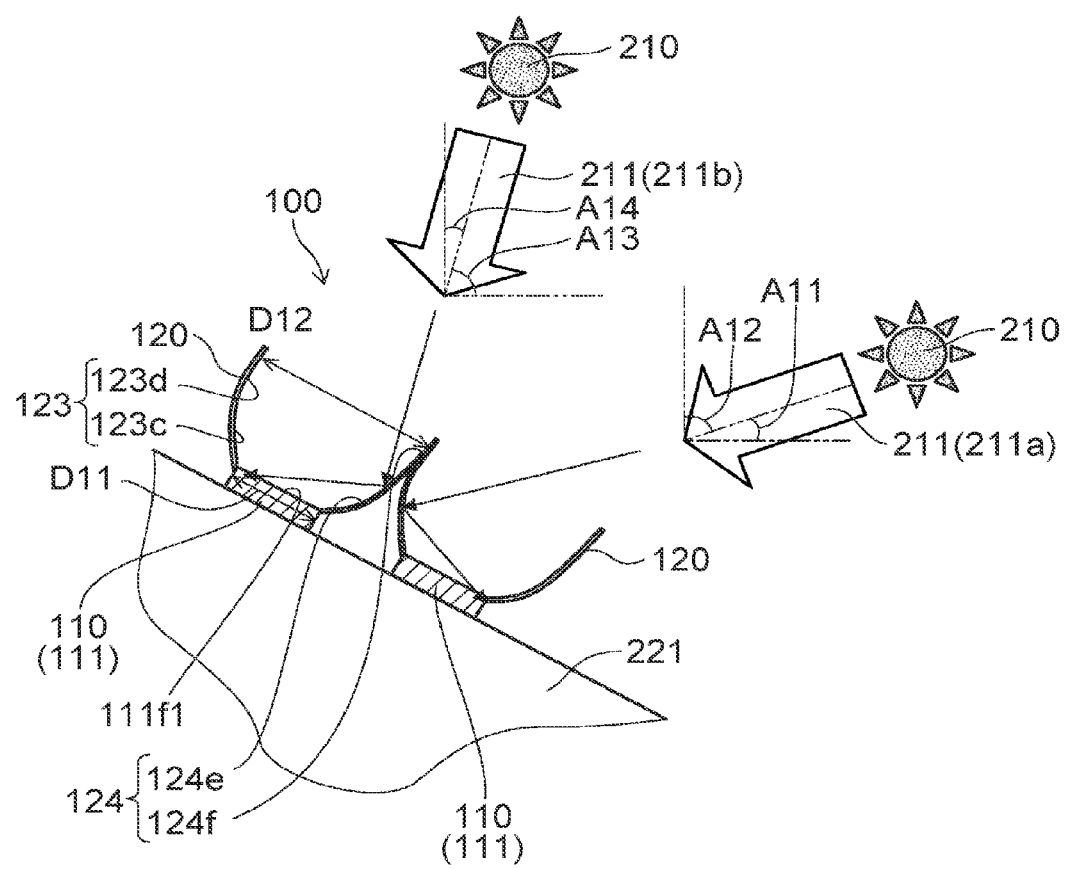
FIG. 1 is a schematic conceptual view showing a solar cell module according to an embodiment.

According to one embodiment, a solar cell module includes a solar cell panel and a concentrator. The solar cell panel includes a solar cell. The concentrator reflects light incident from the outside and irradiates the light onto the solar cell. The concentrator has a first surface and a second surface. The first surface reflects light incident at a first incident angle and irradiates the light incident at the first incident angle onto a first portion within the area of the solar cell. The second surface reflects light incident at a second incident angle and irradiates the light incident at the second incident angle onto a second portion within the area of the solar cell. The second incident angle is different from the first incident angle. The second portion is different from the first portion. The first surface and the second surface are asymmetric as viewed from the solar cell.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

FIG. 1 is a schematic conceptual view showing a solar cell module according to an embodiment.

Figure 2:
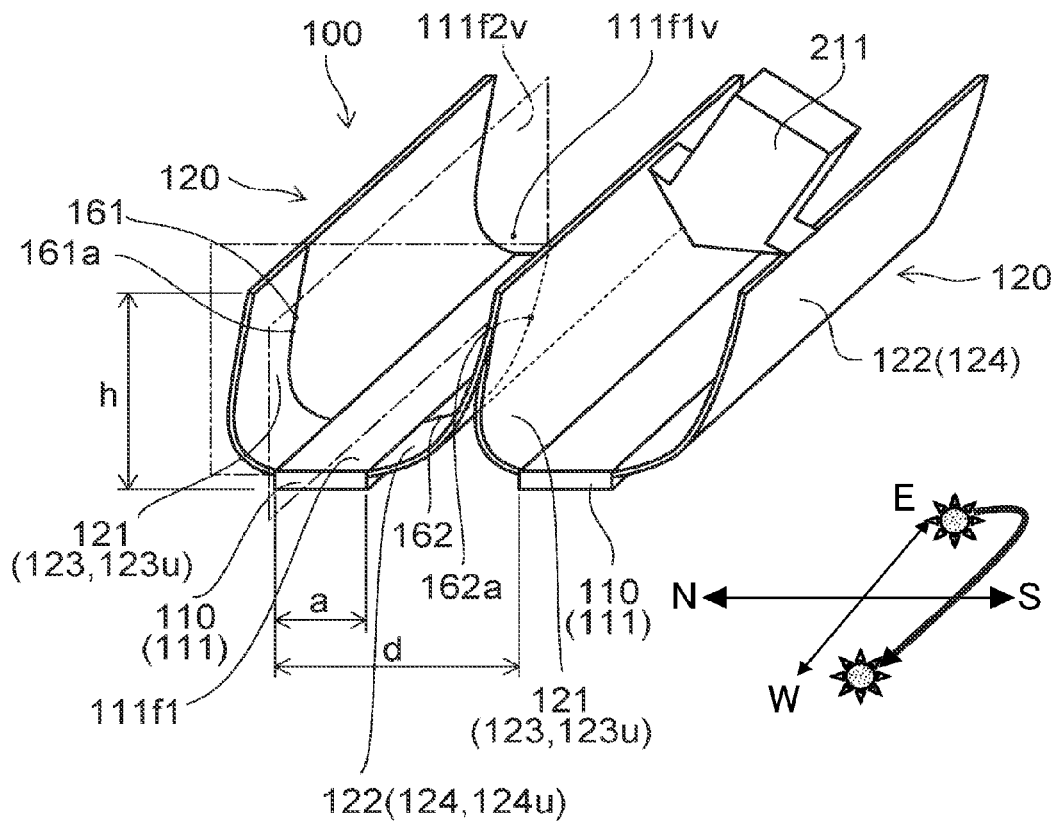
FIG. 2 is a schematic perspective view showing the solar cell module according to the embodiment.

FIG. 2 is a schematic perspective view showing the solar cell module according to the embodiment.

The solar cell module 100 according to the embodiment includes a solar cell panel 110 and a concentrator 120 and is mounted, for example, on a roof 221 facing south, etc.

The solar cell panel 110 includes a solar cell 111. For example, the solar cell 111 is disposed in the interior of the solar cell panel 110. The solar cell panel 110 (the solar cell 111) converts incident light into electrical power.

Two solar cell panels 110 and two concentrators 120 are provided in the solar cell module 100 shown in FIG. 1 and FIG. 2. However, the number of solar cell panels 110 and the number of concentrators 120 is not limited thereto.

As shown in FIG. 2, the concentrator 120 includes a first light concentration plate 121 and a second light concentration plate 122. The solar cell panel 110 is provided between the first light concentration plate 121 and the second light concentration plate 122. The first light concentration plate 121 has a first surface 123. In other words, the first light concentration plate 121 has a parabolic surface configuration. The second light concentration plate 122 has a second surface 124. In other words, the second light concentration plate 122 has a parabolic surface configuration. The concave surface of the first surface 123 of the first light concentration plate 121 opposes the concave surface of the second surface 124 of the second light concentration plate 122. The configuration of the first surface 123 of the first light concentration plate 121 is different from the configuration of the second surface 124 of the second light concentration plate 122. That is, the second light concentration plate 122 and the first light concentration plate 121 are asymmetric as viewed from the solar cell panel 110. In FIG. 2, the east and west directions (EN-direction) and the south and north directions (SN-direction) are illustrated.

As shown in FIG. 1, for example, the concentrator 120 reflects light 211 of the sun 210 and guides the light 211 toward the solar cell panel 110. In the embodiment, a minimum solar elevation A11 of the sun 210 is taken to be 30 degrees; and a maximum solar elevation A13 of the sun 210 is taken to be 80 degrees. For example, the minimum solar elevation A11 is the elevation of the sun 210 in winter. For example, the maximum solar elevation A13 is the elevation of the sun 210 in summer. When the elevation of the sun 210 is the minimum solar elevation A11, an incident angle A12 (a first incident angle) of the light 211 is 60 degrees. On the other hand, when the elevation of the sun 210 is the maximum solar elevation A13, an incident angle A14 (a second incident angle) of the light 211 is 10 degrees. The incident angle A12 is the maximum incident angle of the sunlight for a time period of one year. The incident angle A14 is the minimum incident angle of the sunlight for a time period of one year. For the east and west directions, the concentration of light can be performed for only a limited amount of time because the angle of sunlight changes 180° from sunrise to sunset. For a limited amount of time, the concentration of light can be performed even for the east and west directions.

As described above, the first light concentration plate 121 and the second light concentration plate 122 have parabolic surfaces. For example, when the formula expressing a parabola is $y=x^2/(4p)$, the light that is incident parallel to the y-axis concentrates at the focal point (0, p) of the parabola. The concentration of light is possible by using this property of the parabola. Specifically, the first light concentration plate 121 and the second light concentration plate 122 are mounted so that the focal point (0, p) is included within the area of the solar cell panel 110 (or the solar cell 111).

The focal point of the first surface 123 of the first light concentration plate 121 exists in a first portion within the area of the solar cell panel 110 (or the solar cell 111). The focal point of the second surface 124 of the second light concentration plate 122 exists in a second portion within the area of the solar cell panel 110 (or the solar cell 111). The second portion is different from the first portion. More favorably, the focal point of the first surface 123 of the first light concentration plate 121 is positioned at a first edge portion of the solar cell panel 110 (or the solar cell 111). More favorably, the focal point of the second surface 124 of the second light concentration plate 122 is positioned at a second edge portion of the solar cell panel 110 (or the solar cell 111).

This will now be described further with reference to the drawings.

In the specification of the application, the "edge portion" includes not only the edge of some object, but also a portion that is inside the object in an area from the edge such that the ratio of the distance from the edge to the length in a prescribed direction of the object is within 10%, and/or a portion that is outside the object in an area from the edge such that the ratio of the distance from the edge to the length in the prescribed direction of the object is within 5%.

Figure 3:
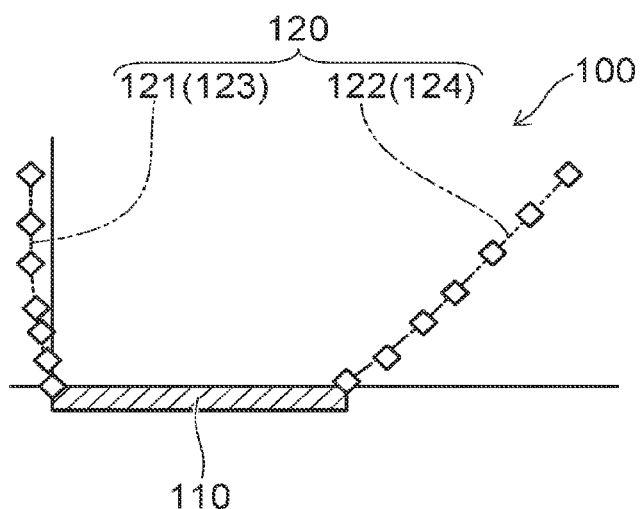
FIG. 3 is a schematic plan view showing the solar cell module according to the embodiment.

FIG. 3 is a schematic plan view showing the solar cell module according to the embodiment.

FIGS. 4A to 4D are schematic plan views showing light that is incident on the solar cell module according to the embodiment.

Figure 5:
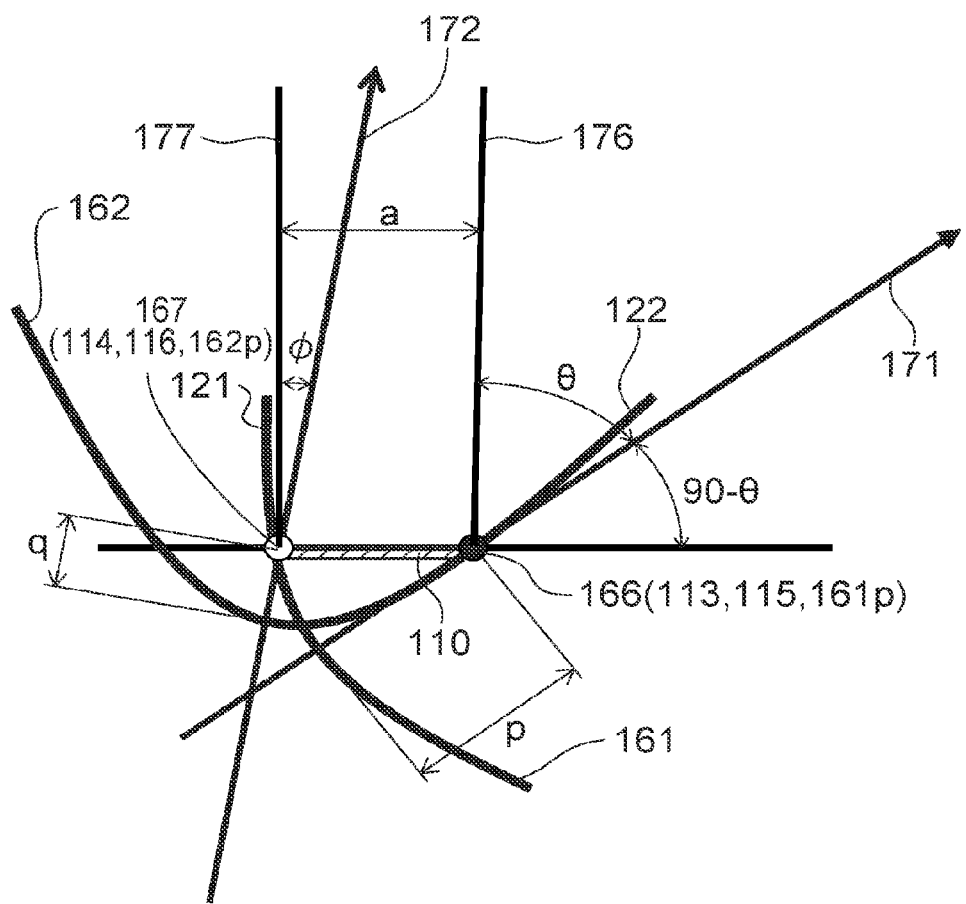
FIG. 5 is a schematic plan view showing the light that is reflected for the parabolas.

FIG. 5 is a schematic plan view showing the light that is reflected for the parabolas.

Figure 4A:
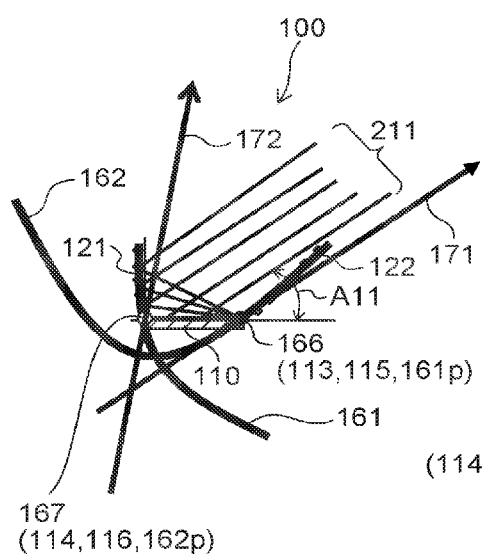
FIGS. 4A to 4D are schematic plan views showing light that is incident on the solar cell module according to the embodiment.
Figure 4B:
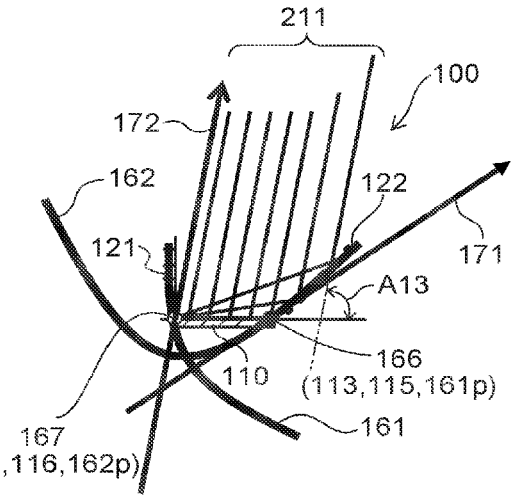
Figure 4C:
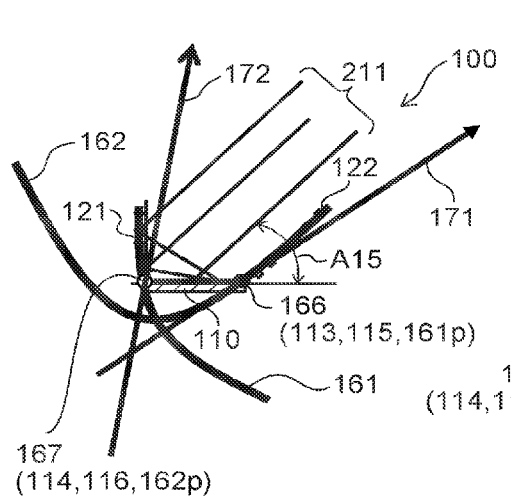
Figure 4D:
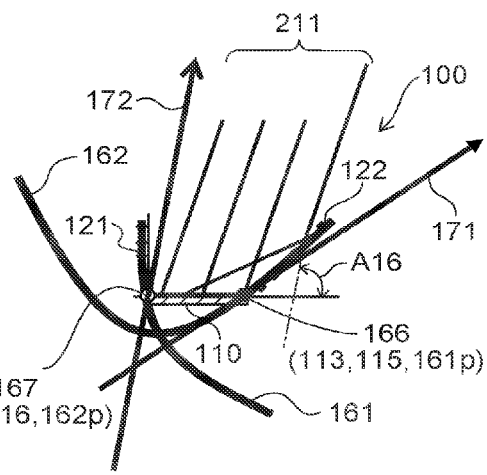

FIG. 4A is a schematic plan view showing the state in which the light 211 of the sun 210 at the minimum solar elevation A11 is incident on the solar cell module 100. FIG. 4B is a schematic plan view showing the state in which the light 211 of the sun 210 at the maximum solar elevation A13 is incident on the solar cell module 100. FIG. 4C is a schematic plan view showing the state in which the light 211 of the sun 210 is incident on the solar cell module 100 when a solar elevation A15 is 45 degrees. FIG. 4D is a schematic plan view showing the state in which the light 211 of the sun 210 is incident on the solar cell module 100 when a solar elevation A16 is 60 degrees.

As shown in FIG. 3, the first light concentration plate 121 and the second light concentration plate 122 have parabolic surface configurations. The second light concentration plate 122 and the first light concentration plate 121 are asymmetric as viewed from the solar cell panel 110.

As shown in FIG. 4A to FIG. 4D, the first light concentration plate 121 is formed along a first parabola 161. The second light concentration plate 122 is formed along a second parabola 162. In the example shown in FIG. 4A to FIG. 4D, a first axis 171 is parallel to the travel direction of the light 211 of the sun 210 at the minimum solar elevation A11 and corresponds to the y-axis of the first parabola 161. A second axis 172 is parallel to the travel direction of the light 211 of the sun 210 at the maximum solar elevation A13 and corresponds to the y-axis of the second parabola 162.

As shown in FIG. 4A, a portion of the light 211 that is incident parallel to the first axis 171 (the y-axis of the first parabola 161) is reflected at the first light concentration plate 121 and concentrates at a focal point 166 of the first parabola 161. The light 211 that is incident parallel to the first axis 171 but is not reflected at the first light concentration plate 121 is incident directly on the solar cell panel 110.

As shown in FIG. 4B, a portion of the light 211 that is incident parallel to the second axis 172 (the y-axis of the second parabola 162) is reflected at the second light concentration plate 122 and concentrates at a focal point 167 of the second parabola 162. The light 211 that is incident parallel to the second axis 172 but is not reflected at the second light concentration plate 122 is incident directly on the solar cell panel 110.

As shown in FIG. 4C, for example, when the solar elevation A15 is 45 degrees, a portion of the light 211 of the sun 210 is reflected at the first light concentration plate 121 and is incident on the solar cell panel 110 on the focal point 167 side of the second parabola 162 as viewed from the focal point 166 of the first parabola 161. For example, when the solar elevation A15 is 45 degrees, the light 211 of the sun 210 that is not reflected at the first light concentration plate 121 is incident directly on the solar cell panel 110.

As shown in FIG. 4D, for example, when the solar elevation A16 is 60 degrees, a portion of the light 211 of the sun 210 is reflected at the second light concentration plate 122 and is incident on the solar cell panel 110 on the focal point 166 side of the first parabola 161 as viewed from the focal point 167 of the second parabola 162. For example, when the solar elevation A16 is 60 degrees, the light 211 of the sun 210 that is not reflected at the second light concentration plate 122 is incident directly on the solar cell panel 110.

The light 211 that is reflected at the parabolas will now be described further.

As shown in FIG. 5, when the formula expressing the first parabola 161 is $y=x^2/(4p)$, the light that travels parallel to the first axis 171 concentrates at the focal point 166 (0, p) of the first parabola 161. When the formula expressing the second parabola 162 is $y=x^2/(4q)$, the light that travels parallel to the second axis 172 concentrates at the focal point 167 (0, q) of the second parabola 162.

Here, the rotation matrix for rotating x counterclockwise by an angle θ to obtain X and rotating y counterclockwise by the angle θ to obtain Y is expressed by the following formula.

[Formula 1]

$$\begin{bmatrix} X \\ Y \end{bmatrix} = \begin{bmatrix} \cos\theta & -\sin\theta \\ \sin\theta & \cos\theta \end{bmatrix} \begin{bmatrix} x \\ y \end{bmatrix} \quad (1)$$

When the first axis 171 is taken to be the y-axis, the formula expressing the first parabola 161 is as follows.

[Formula 2]

$$\begin{aligned} p - a\cos(90 - \theta) &= \frac{1}{4p}(a\sin(90 - \theta))^2 \\ p - a\sin\theta &= \frac{1}{4p}(a\cos\theta)^2 \\ p^2 - pa\sin\theta &= \frac{1}{4}a^2\cos^2\theta \\ p &= \frac{a}{2}(\sin\theta + 1) \\ y &= \frac{1}{2a(1 + \sin\theta)}x^2 \end{aligned} \quad (2)$$

When the second axis 172 is taken to be the y-axis, the formula expressing the second parabola 162 is as follows.

[Formula 3]

$$\begin{aligned} q + a\sin\phi &= \frac{1}{4q}(a\cos\phi)^2 \\ q &= \frac{a}{2}(1 - \sin\phi) \\ y &= \frac{1}{2a(1 - \sin\phi)}x^2 \end{aligned} \quad (3)$$

In Formula (2) and Formula (3), a is the width of the solar cell 111. In Formula (2), the angle θ is the incident angle A12 of the light of the sun 210 at the minimum solar elevation A11. In Formula (3), an angle ϕ is the incident angle A14 of the light of the sun 210 at the maximum solar elevation A13.

Then, the first axis 171 is converted to a first y-axis 176 by rotating in the clockwise direction by the angle θ and by adjusting the origin position. The first axis 171 is converted to the first y-axis 176 and the origin position is adjusted as follows.

[Formula 4]

$$\begin{aligned} X &= x\cos\theta + \frac{1}{2a(1 + \sin\theta)}x^2\sin\theta - \frac{a}{2}(1 + \sin\theta)\sin\theta + a \\ Y &= -x\sin\theta + \frac{1}{2a(1 + \sin\theta)}x^2\cos\theta - \frac{a}{2}(1 + \sin\theta)\cos\theta \end{aligned} \quad (4)$$

When the second axis 172 is converted to a second y-axis 177, the second axis 172 is rotated in the clockwise direction by the angle ϕ; and the origin position is adjusted. The second axis 172 is converted to the second y-axis 177 and the origin position is adjusted as follows.

[Formula 5]

$$\begin{aligned} X &= x\cos\phi + \frac{1}{2a(1 - \sin\phi)}x^2\sin\phi - \frac{a}{2}(1 - \sin\phi)\sin\phi \\ Y &= -x\sin\phi + \frac{1}{2a(1 - \sin\phi)}x^2\cos\phi - \frac{a}{2}(1 - \sin\phi)\cos\phi \end{aligned} \quad (5)$$

In the case where a refractive index layer having a refractive index n is provided, the formula $\theta'=\sin^{-1}(\sin(\theta)/n)$ holds. In such a case, the refractive index ($n_{ambient\ air}$) of the ambient air is taken to be 1. Details of the refractive index layer are described below.

In the solar cell module 100 according to the embodiment as shown in FIG. 4A to FIG. 4D, the focal point 166 of the first parabola 161 is included within the area of the solar cell panel 110 (or the solar cell 111). The focal point 167 of the second parabola 162 is included within the area of the solar cell panel 110 (or the solar cell 111).

The focal point 166 of the first parabola 161 exists in a first portion 113 within the area of the solar cell panel 110 (or the solar cell 111). The focal point 167 of the second parabola 162 exists in a second portion 114 within the area of the solar cell panel 110 (or the solar cell 111). The second portion 114 is different from the first portion 113. More favorably, the focal point 166 of the first parabola 161 is positioned at a first edge portion 115 of the solar cell panel 110 (or the solar cell 111). More favorably, the focal point 167 of the second parabola 162 is positioned at a second edge portion 116 of the solar cell panel 110 (or the solar cell 111). The "edge portion" is as described above in regard to FIG. 1 and FIG. 2.

According to the embodiment, all of the light 211 of the sun 210 between the minimum solar elevation A11 and the maximum solar elevation A13 is incident on the solar cell panel 110. By using the first light concentration plate 121 and the second light concentration plate 122 that are asymmetric to each other as viewed from the solar cell panel 110, for example, the solar cell module 100 can be mounted on a roof facing north, which is relatively unsuitable for utilizing sunlight. The solar cell module 100 according to the embodiment includes the first light concentration plate 121 described above and the second light concentration plate 122 described above. Thereby, compared to the case where the solar cell module 100 does not include the first light concentration plate 121 and the second light concentration plate 122, the concentration ratio is improved; and the surface area of the solar cell panel 110 can be reduced.

The concentration ratio is expressed by d/a using the width a of the solar cell 111 and the pitch d of the solar cell 111 (referring to FIG. 2). The concentration ratio (d/a) is regulated by a height h of the concentrator 120 (referring to FIG. 2). In the case where the height h of the concentrator 120 is relatively high, the concentration ratio is relatively high. As described above, because the solar cell module 100 according to the embodiment can improve the concentration ratio, the concentration ratio can be ensured even in the case where the height h of the concentrator 120 is suppressed. Thereby, the thickness of the solar cell module 100 can be reduced. Generally, the reflection of the light at the light concentration plate 121 is not 100%. Therefore, d/a is lower than that of the case where the light reflectance at the light concentration plate 121 is 100%. Therefore, in the embodiment, the concentration ratio d/a is used as the ideal concentration ratio for convenience.

The maximum concentration ratio is obtained when the focal point 166 of the first parabola 161 is positioned at the first edge portion 115, and the focal point 167 of the second parabola 162 is positioned at the second edge portion 116. Thereby, the solar cell 111 and the solar cell panel 110 can be minimized.

The parabolic surface configuration of the concentrator 120 is a basic geometrical configuration. Therefore, the fabrication of the concentrator 120 is relatively easy.

According to the embodiment, the solar cell module 100 can perform similar operations year round. Thereby, it is unnecessary for the solar cell panel 110 to follow the sun 210 according to the season. Therefore, a drive device to drive the solar cell panel 110 or the like is unnecessary.

The solar cell module 100 according to the embodiment includes the solar cell panel 110 and the concentrator 120. The solar cell panel 110 has a first cell surface 111f1. The first cell surface 111f1 includes the first portion 113 and the second portion 114.

The concentrator 120 has the first surface 123, and the second surface 124 that is separated from the first surface 123. A first light 211a that is incident on the first surface 123 at a first incident angle A11 is incident on the first portion 113. A second light 211b that is incident on the second surface 124 at the second incident angle A14 is incident on the second portion 114.

The first surface 123 includes the first parabola 161 where the first surface 123 intersects a first perpendicular plane 111f1v perpendicular to the first cell surface 111f1. The first perpendicular plane 111f1v includes a direction from the first portion 113 toward the second portion 114. The second surface 124 includes the second parabola 162 where the second surface 124 intersects the first perpendicular plane 111f1v.

A first point 161a on the first parabola 161 and a second point 162a on the second parabola 162 are asymmetric with respect to a second perpendicular plane 111f2v perpendicular to the first cell surface 111f1 and the first perpendicular plane 111f1v.

The first portion 113 includes a first focal point 161p of the first parabola 161. The second portion 114 includes a second focal point 162p of the second parabola 162. The solar cell 111 includes the first edge portion 115 and the second edge portion 116. The first edge portion 115 includes the first focal point 161p of the first parabola 161. The second edge portion 116 includes the second focal point 162p of the second parabola 162.

The first surface 123 has a first concave surface 123u. The second surface 124 has a second concave surface 124u. The first concave surface 123u opposes the second concave surface 124u.

The first incident angle A11 is the one-year maximum value of the angle between the sunlight and a direction perpendicular to the ground surface. The second incident angle A14 is the one-year minimum value of the angle between the sunlight and the direction perpendicular to the ground surface.

The concentrator 120 includes the first light concentration plate 121 that has the first surface 123, and the second light concentration plate 122 that has the second surface 124.

Figure 6A:
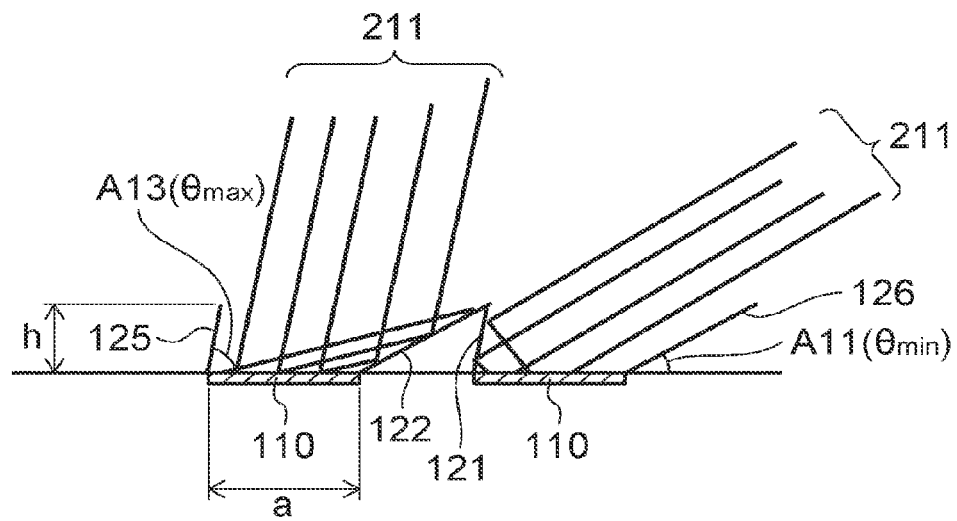
FIGS. 6A and 6B are schematic views showing another example of the concentrator of the embodiment.
Figure 6B:
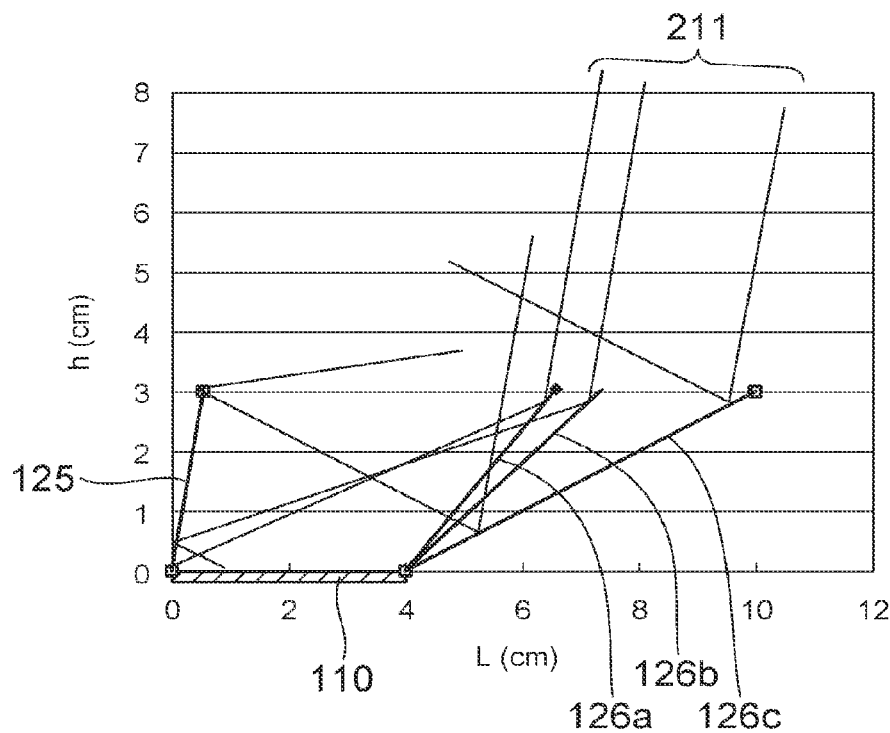

FIGS. 6A and 6B are schematic views showing another example of the concentrator of the embodiment.

FIG. 6A is a schematic plan view showing the light reflected by the concentrator of the example. FIG. 6B is a graph of the reflection state of the light when the angle of the second light concentration plate is changed.

In the example shown in FIG. 6A and FIG. 6B, a first light concentration plate 125 has a planar surface. In other words, the first light concentration plate 125 has a planar configuration. A second light concentration plate 126 has a planar surface. In other words, the second light concentration plate 126 has a planar configuration.

In the example, the height h is expressed by $h = a \cdot \sin(\theta_m - \theta_{min})$ for the first light concentration plate 125 and for the second light concentration plate 126. The concentration ratio is expressed by $1 + \cos(\theta_{max} - \theta_{min}) - h/a/\tan(\theta_{max})$.

The angle $\theta_{min}$, the angle $\theta_{max}$, and the width a of the solar cell 111 are set respectively so that $\theta_{min} = 30$ degrees, $\theta_{max} = 80$ degrees, and $a = 4$ centimeters (cm).

In such a case, the height h is $h = 3.06$ cm. The concentration ratio is about 1.508.

In the case where a second concentrator 126a is employed as shown in FIG. 6B, the amount of the light 211 that is reflected by the second concentrator 126a and incident on the solar cell panel 110 is relatively low. Therefore, the second concentrator 126a has room for improvement.

When employing a second concentrator 126c, a relatively large portion of the light 211 reflected by the second concentrator 126c is radiated outside the solar cell panel 110 without being incident on the solar cell panel 110. Therefore, the second concentrator 126c has room for improvement.

When employing a second concentrator 126b, a relatively large portion of the light 211 reflected by the second concentrator 126b is incident on the solar cell panel 110. Therefore, for the second concentrator 126b, there is room for improvement for increasing the concentration ratio.

In the example, there is a limiting formula for the width a of the solar cell 111, the height h of the first light concentration plate 125 and the second light concentration plate 126, and the angles $\theta_{min}$ and $\theta_{max}$.

In the case where the first light concentration plate 125 and the second light concentration plate 126 have planar configurations, focal points such as those of parabolas do not exist. Therefore, compared to the case where the first light concentration plate 125 and the second light concentration plate 126 have parabolic surface configurations, the light 211 can be dispersed.

Another embodiment will now be described with reference to the drawings.

Figure 7:
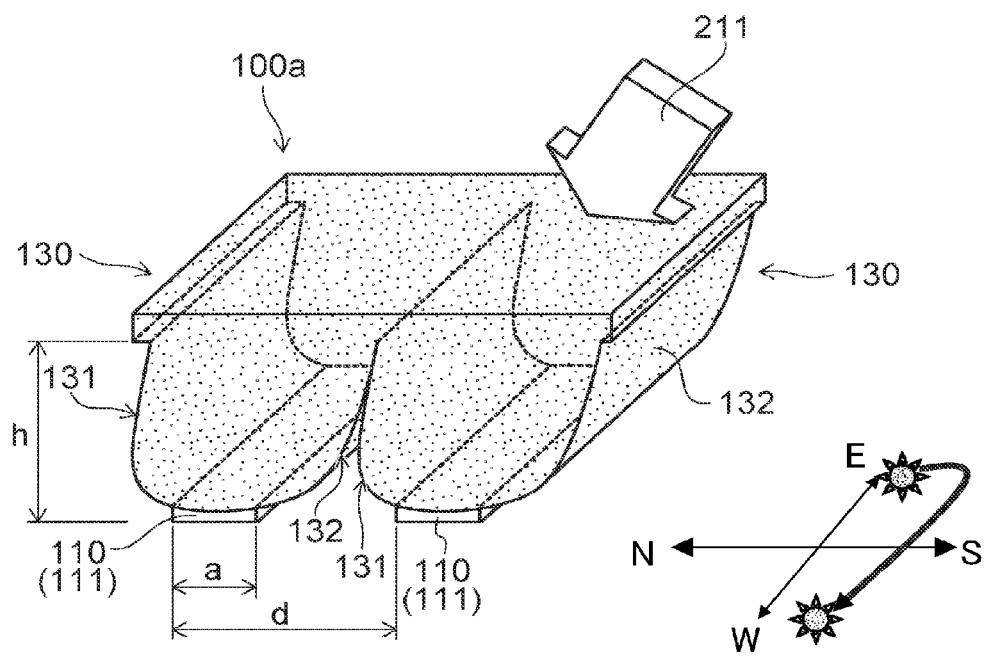
FIG. 7 is a schematic perspective view showing a solar cell module according to another embodiment.

FIG. 7 is a schematic perspective view showing a solar cell module according to the embodiment.

The solar cell module 100a according to the embodiment includes the solar cell panel 110 and a concentrator 130.

The solar cell panel 110 is as described above in regard to FIG. 1 to FIG. 6B.

Two solar cell panels 110 and two concentrators 130 are provided in the solar cell module 100a shown in FIG. 7. However, the number of solar cell panels 110 and the number of concentrators 130 is not limited thereto.

In the embodiment described above in regard to FIG. 1 to FIG. 6B, the concentrator 120 reflects the light 211. Loss (reflection loss) occurs when the light 211 is reflected by any object surface.

By reducing the reflecting surface area in the embodiment, the reflection loss is reduced; and the concentration ratio is improved further.

The refractive index of the concentrator 130 is higher than the refractive index of the ambient air. That is, the concentrator 130 includes a so-called high refractive index material. For example, a polymethylmethacrylate resin (an acrylic resin (PMMA)) or the like is used as the material of the concentrator 130. For example, the concentrator 130 is formed by injection molding, etc. As shown in FIG. 7, the concentrator 130 has a first surface 131 and a second surface 132 and has a convex configuration on the solar cell panel 110 side. When viewed from the solar cell panel 110, the second surface 132 may be asymmetric to the first surface 131 or symmetric to the first surface 131.

It is favorable for the light 211 to undergo total internal reflection for at least a portion of the surfaces (the first surface 131 and the second surface 132) of the concentrator 130. It is unnecessary to provide a mirror coating on the surface of the concentrator 130 in the region where the light 211 undergoes total internal reflection. Thereby, in the region where the light 211 undergoes total internal reflection, the reflection loss can be reduced.

In the embodiment, the mirror coating is not eliminated for the entire first surface 131 and the entire second surface 132. As described above in regard to FIG. 1 to FIG. 6B, even in the case where the entire first surface 131 and the entire second surface 132 reflect the light 211, the concentration ratio can be improved.

As described above, the concentrator 130 includes the high refractive index material. Thereby, the incident angle of the light 211 can be relaxed.

This will now be described further with reference to the drawings.

Figure 8:
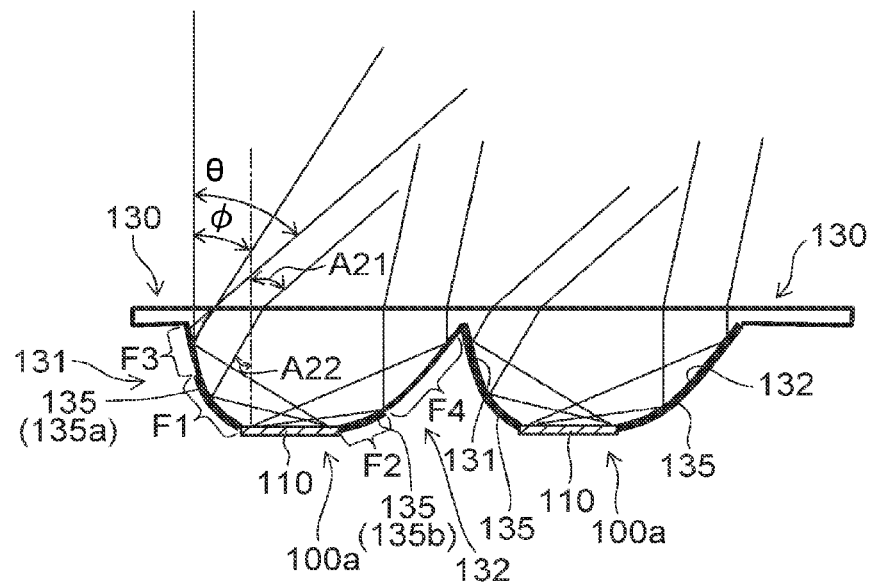
FIG. 8 is a schematic conceptual view showing the solar cell module according to the embodiment.

FIG. 8 is a schematic conceptual view showing the solar cell module according to the embodiment.

Because the refractive index of the concentrator 130 is higher than the refractive index of the ambient air, a refraction angle A22 is smaller than an incident angle A21 as shown in FIG. 8. Therefore, the substantial incident angle in the interior of the concentrator 130 can be increased. That is, the incident angle of the light 211 can be relaxed. Thereby, the thickness of the solar cell module 100a can be reduced for the same range of incident angles.

To further increase the range of the incident angles of the light 211, it is more favorable to increase the clarity of the concentrator 130. Also, to further increase the range of the incident angles of the light 211, it is more favorable to use a material having a higher refractive index as the material of the concentrator 130. The trapping effect of the light 211 can be increased by gradually reducing the refractive index from the interior of the concentrator 130 toward the outside.

The solar cell module 100a on the right side of FIG. 8 is an example in which a mirror coating 135 is provided on the entire first surface 131 and the entire second surface 132.

The solar cell module 100a on the left side of FIG. 8 is an example in which the mirror coating 135 is provided on a portion of the first surface 131 and a portion of the second surface 132. More specifically, the mirror coating 135 is provided in a first region F1 of the first surface 131 and a second region F2 of the second surface 132.

For example, silver (Ag), aluminum (Al), etc., may be used as the material of the mirror coating 135.

Figure 9A:
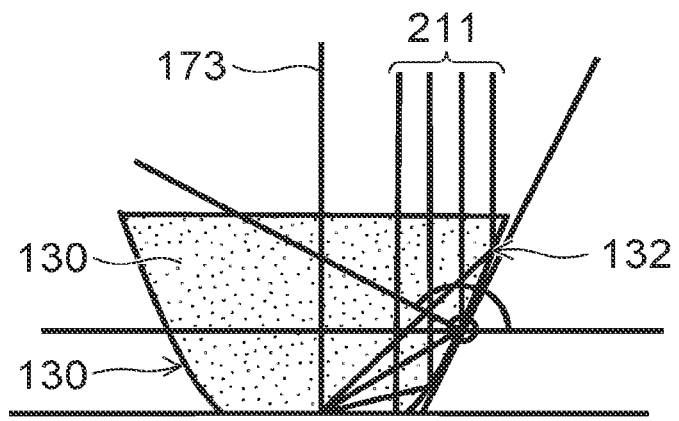
FIGS. 9A and 9B are schematic views showing the total internal reflection of the light.
Figure 9B:
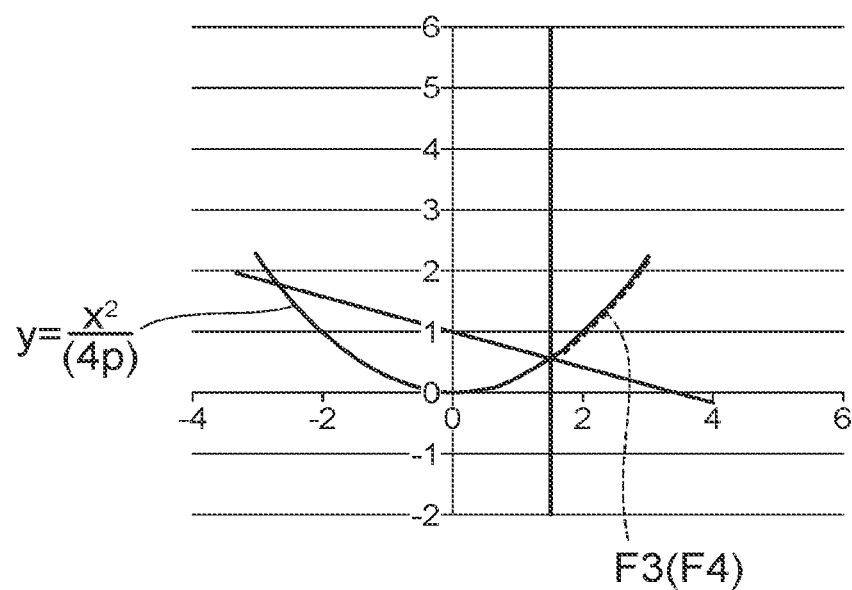

FIGS. 9A and 9B are schematic views showing the total internal reflection of the light.

FIG. 9A is a schematic plan view showing the light incident on the solar cell module according to the embodiment. FIG. 9B is a schematic plan view showing the area where the mirror coating is unnecessary.

For the parabolic surface of the concentrator 130, the light for which it is most difficult to undergo total internal reflection is the light that is parallel to the axis of the parabola. As shown in FIG. 9A, for example, the light 211 that is parallel to an axis 173 of the parabola of the second surface 132 is the light 211 that is parallel to the axis 173 of the parabola. Therefore, in the embodiment, the conditions at which the light 211 that is parallel to the axis 173 of the parabola undergoes total internal reflection are considered.

FIG. 9A and FIG. 9B show an example in which the second surface 132 and the first surface 131 are symmetric as viewed from the solar cell panel 110.

The conditions at which the light 211 parallel to the axis 173 of the parabola undergoes total internal reflection is expressed by the following formula, where n is the refractive index of the concentrator 130, and the formula of the parabola is $y=x^2/(4p)$.

[Formula 6]

$$\tan\left(\sin^{-1}\left(\frac{1}{n}\right)\right) < \frac{1}{2p}x \tag{6}$$

In Formula (6), p is the value of the focal point of the parabola. In the case where the second surface 132 is asymmetric to the first surface 131 as viewed from the solar cell panel 110, the value p of the focal point of the first surface 131 is different from the value p of the focal point of the second surface 132.

In the case where the tilt of the solar cell panel 110 is steep, the conditions of the solar cell panel 110 change. This will now be described with reference to the drawings.

Figure 10A:
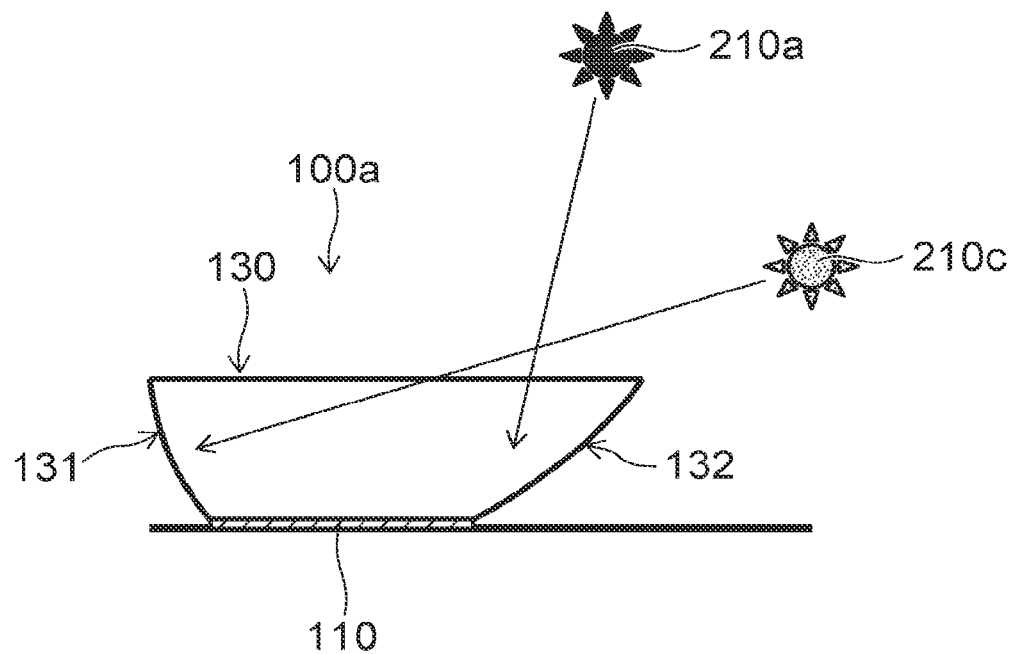
FIGS. 10A and 10B are schematic plan views showing different tilts of the solar cell panel.
Figure 10B:
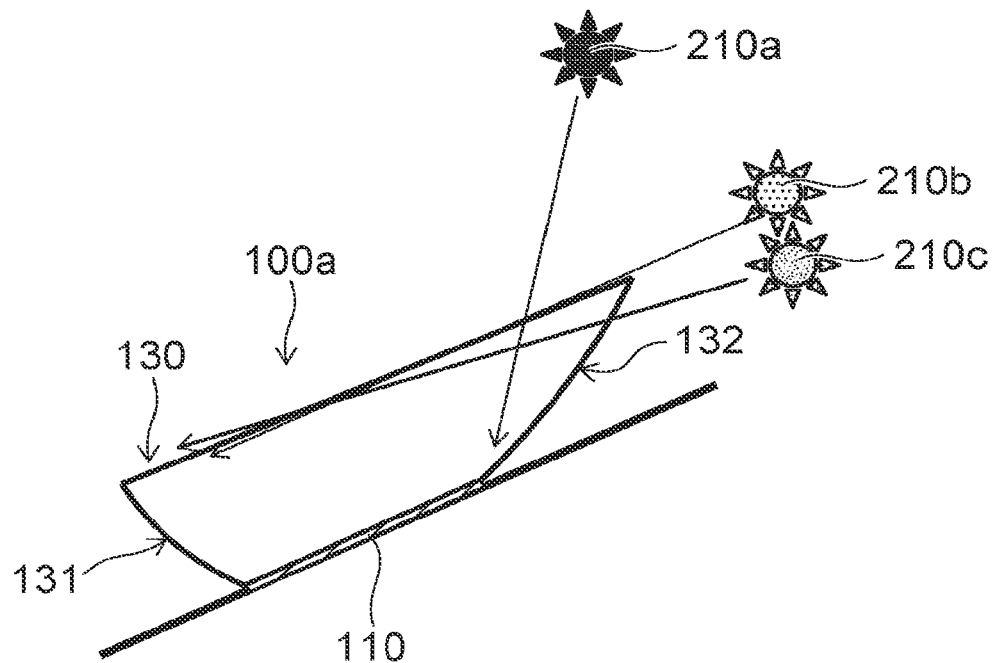

FIGS. 10A and 10B are schematic plan views showing different tilts of the solar cell panel.

Figure 11A:
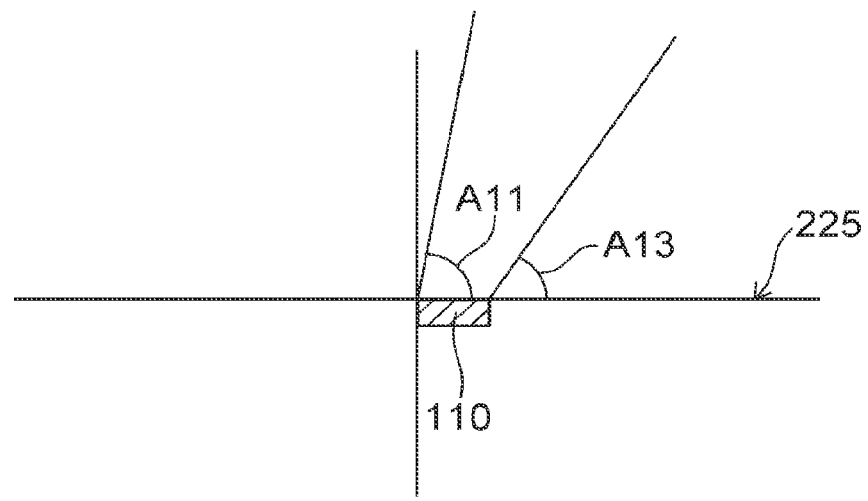
FIGS. 11A and 11B are schematic plan views showing a method for mounting the solar cell panel.
Figure 11B:
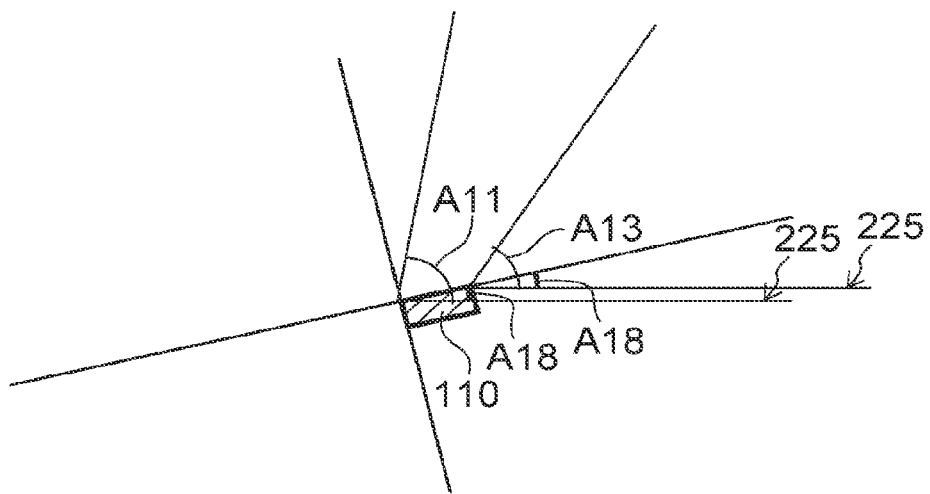

FIGS. 11A and 11B are schematic plan views showing the method for mounting the solar cell panel.

FIG. 10A is a schematic plan view showing an example in which the tilt of the solar cell panel is gradual compared to that of the example of FIG. 10B. FIG. 10B is a schematic plan view showing an example in which the tilt of the solar cell panel is steep compared to that of the example of FIG. 10A.

FIG. 11A is a schematic plan view showing an example in which the placement location is horizontal. FIG. 11B is a schematic plan view showing an example in which the placement location is tilted.

The solar elevation of the sun 210a shown in FIG. 10A is the same as the solar elevation of the sun 210a shown in FIG. 10B. The solar elevation of the sun 210c shown in FIG. 10A is the same as the solar elevation of the sun 210c shown in FIG. 10B. The solar elevation of the sun 210b shown in FIG. 10B is a solar elevation between the sun 210c and the sun 210a.

In FIG. 10B, the solar cell panel 110 is mounted on a location (e.g., a roof facing north, etc.) tilted toward the side opposite the sun. In such a case, as shown in FIG. 10B, the light 211 of the sun 210c of the minimum solar elevation is not incident on the concentrator 130 and is not incident on the solar cell panel 110. Other conditions of the example of FIG. 10B may include the arctic, the antarctic, the northern side of a hill, etc., where the solar elevation is low compared to that of other regions.

Therefore, in such a case, the angle of the first surface 131 and the like are modified appropriately according to the tilt angle of the location (e.g., the land, the roof, etc.) where the solar cell panel 110 is mounted.

For example, as shown in FIG. 11A, in the case where the solar cell panel 110 is mounted at a location tilted at an angle A18 from a horizontal plane 225, the incident angle is reduced by the amount of the angle A18 of the placement location. That is, the incident angle of the light of the sun at the maximum solar elevation A13 and the incident angle of the light of the sun at the minimum solar elevation A11 are modified appropriately according to the angle A18 of the placement location.

In the example, it is assumed that the solar cell panel 110 is mounted at a flat location.

Returning now to FIG. 9B, the mirror coating 135 is necessary according to the configuration of the concentrator 130 in the region at the vicinity of the solar cell 111. On the other hand, the light 211 that is incident on the concentrator 130 undergoes total internal reflection in regions more than a prescribed distance away from the solar cell 111. Therefore, it is unnecessary to provide the mirror coating 135 in the region where the light 211 undergoes total internal reflection; and the reflection loss can be reduced. FIG. 9B shows the case where the refractive index n of the concentrator 130 is 1.493.

Figure 12A:
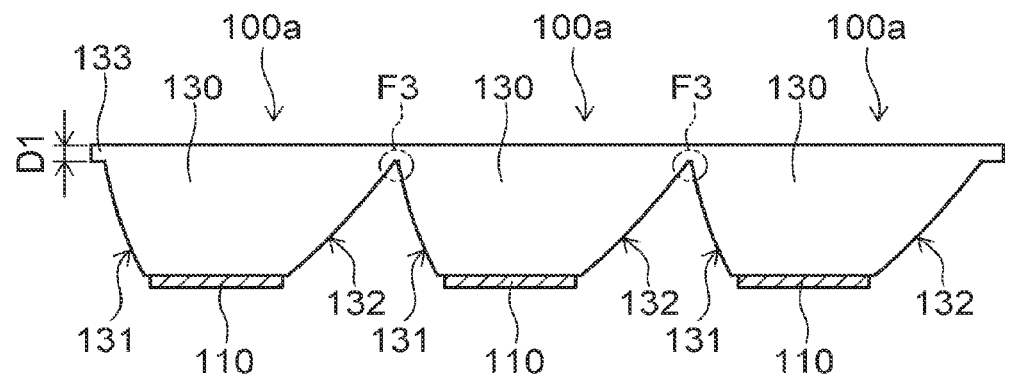
FIGS. 12A to 12C are schematic plan views showing examples in which three solar cell modules are connected.
Figure 12B:
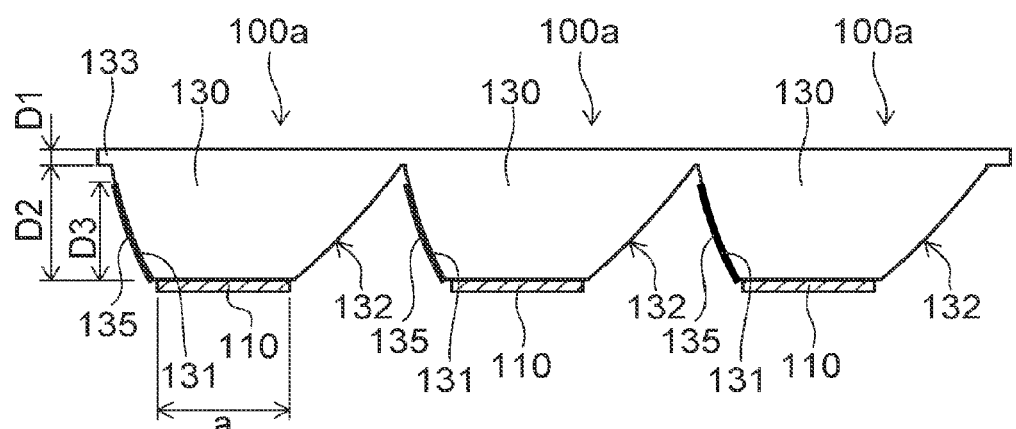
Figure 12C:
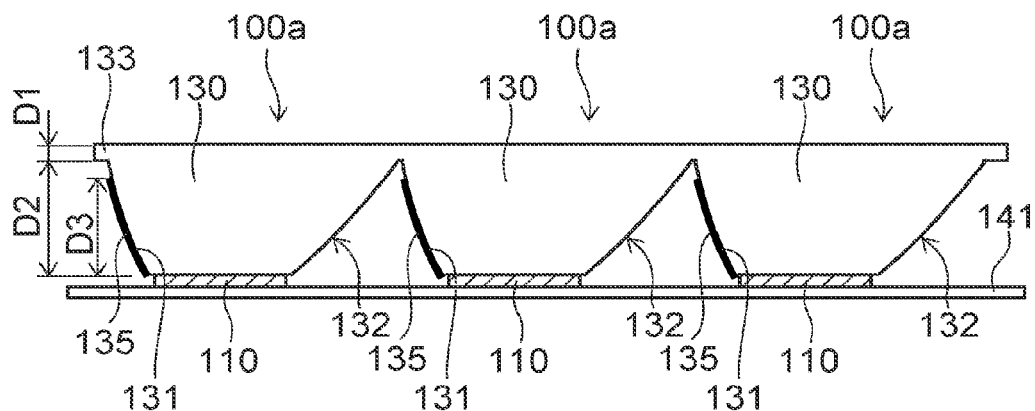

FIGS. 12A to 12C are schematic plan views showing examples in which three solar cell modules are connected.

FIG. 12A is a schematic plan view showing an example in which the mirror coating 135 is not provided on the concentrator 130. FIG. 12B is a schematic plan view showing an example in which the mirror coating 135 is provided on a portion of the concentrator 130. FIG. 12C is a schematic plan view showing an example in which an anti-reflection film (a reflection suppression film) 141 is provided.

Three solar cell modules 100a are connected in the example shown in FIG. 12A. The first surface 131 may not be connected directly to the second surface 132 in a region F3 where the two solar cell modules 100a are adjacent to each other. Even in such a case, total internal reflection is possible for the entire first surface 131 and the entire second surface 132. Thereby, in the example shown in FIG. 12A, the mirror coating 135 is not provided.

PMMA, etc., may be used as the material of the concentrator 130. The refractive index of PMMA is 1.493. The concentrator 130 includes a plate unit 133. The plate unit 133 suppresses the mutual-separation of the multiple concentrators 130 that would cause the multiple concentrators 130 to become separate bodies. A thickness D1 of the plate unit 133 is, for example, about 0.5 cm.

In the example shown in FIG. 12B, compared to the example shown in FIG. 12A, the mirror coating 135 is provided on a portion of the first surface 131. For example, silver (Ag), aluminum (Al), etc., may be used as the material of the mirror coating 135. However, the material of the mirror coating 135 is not limited thereto; and a material having a reflectance similar to those of silver (Ag), aluminum (Al), etc., may be used.

For example, the minimum solar elevation A11 of the sun 210 is taken to be 30 degrees; and the maximum solar elevation A13 of the sun 210 is taken to be 80 degrees. In such a case, the incident angle of the light 211 of the sun 210 at the maximum solar elevation A13 is 10 degrees. The incident angle of the light 211 of the sun 210 at the minimum solar elevation A11 is 60 degrees. In the case where the material of the concentrator 130 is PMMA, the refractive index of the PMMA is 1.493; and therefore, the substantial incident angle in the interior of the concentrator 130 is not less than 6.68 degrees and not more than 35.45 degrees.

The width a of the solar cell 111 is set to 4 cm. The thickness D1 of the plate unit 133 is set to 0.5 cm; and a dimension D2 between the solar cell panel 110 and the lower portion of the plate unit 133 is set to 3.5 cm. 100 nanometers (nm) of $MgF_2$ is deposited on the upper surface of the plate unit 133.

From calculations based on such conditions, total internal reflection does not occur in the region where the height of the first surface 131 is 2.83 cm or less. On the other hand, total internal reflection occurs in the region where the height of the first surface 131 is higher than 2.83 cm. Therefore, in the example shown in FIG. 12B, a height D3 of the mirror coating 135 is 2.83 cm. In other words, the mirror coating 135 is unnecessary in the region where the height of the first surface 131 is higher than 2.83 cm. The ideal concentration ratio is about 1.78.

In the example shown in FIG. 12C, compared to the example shown in FIG. 12B, the anti-reflection film 141 is provided on the side opposite to the concentrator 130 as viewed from the solar cell panel 110. The anti-reflection film 141 suppresses reflections at the surface of the concentrator 130 of the light 211 passing through the interior of the concentrator 130 and traveling toward the solar cell panel 110.

The anti-reflection film will now be described further with reference to the drawings.

Figure 13A:
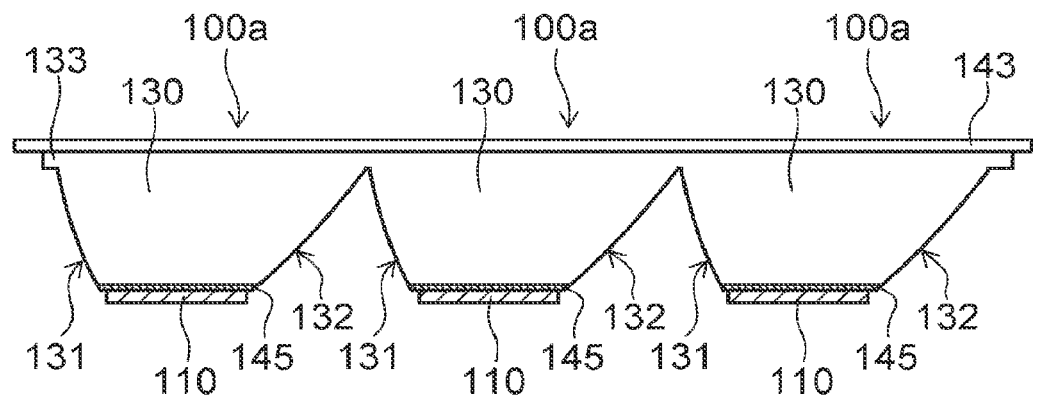
FIGS. 13A and 13B are schematic plan views showing the anti-reflection film of the embodiment.
Figure 13B:
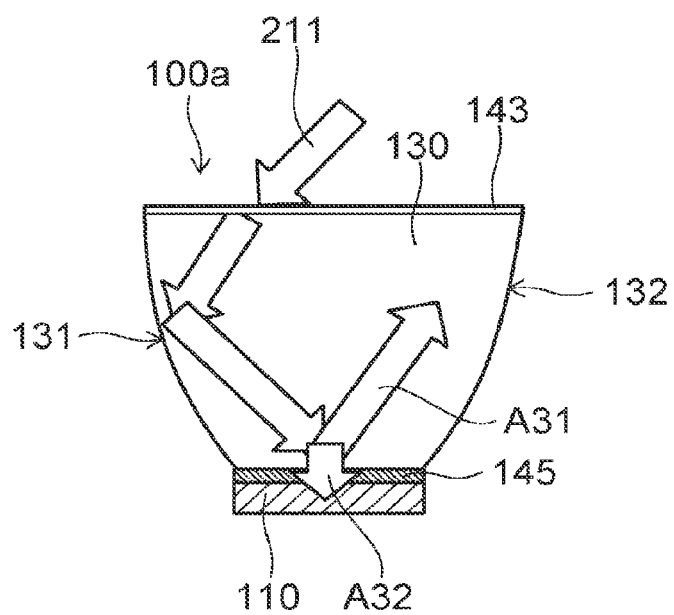

FIGS. 13A and 13B are schematic plan views showing the anti-reflection film of the embodiment.

FIG. 13A is a schematic plan view showing an example in which three solar cell modules 100a are connected. FIG. 13B is a schematic plan view showing the light 211 traveling through the interior of the concentrator 130 of the embodiment.

In the examples shown in FIG. 13A and FIG. 13B, a first anti-reflection film (reflection suppression film) 143 is provided on the upper surface of the plate unit 133 of the concentrator 130. The refractive index of the first anti-reflection film 143 is higher than the refractive index of the ambient air and lower than the refractive index of the concentrator 130. It is more favorable for the refractive index of the first anti-reflection film 143 to be about 1.22. Or, the material of the first anti-reflection film 143 may be $MgF_2$ (having a refractive index of about 1.38).

It is unfavorable for the light 211 passing through the interior of the concentrator 130 and traveling toward the solar cell panel 110 to be reflected at the interface between the concentrator 130 and the solar cell panel 110 as illustrated by arrow A31 shown in FIG. 13B. It is favorable for the light 211 passing through the interior of the concentrator 130 and traveling toward the solar cell panel 110 to pass through the interface between the concentrator 130 and the solar cell panel 110 to be incident on the solar cell panel 110 as illustrated by arrow A32 shown in FIG. 13B.

Therefore, in the example shown in FIG. 13A and FIG. 13B, a second anti-reflection film (a reflection suppression film) 145 is provided between the concentrator 130 and the solar cell panel 110. It is favorable for the refractive index of the second anti-reflection film 145 to have a value between the refractive index of the solar cell 111 and the refractive index of the concentrator 130. That is, it is favorable for formula $n_p<n_m<n_c$ to hold, where $n_c$ is the refractive index of the solar cell 111, $n_p$ is the refractive index of the concentrator 130, and $n_m$ is the refractive index of the second anti-reflection film 145. Or, the refractive index of the second anti-reflection film 145 may decrease gradually (be graded) from the concentrator 130 side toward the solar cell panel 110 side.

It is more favorable for the refractive index of the second anti-reflection film 145 to satisfy the following formula.

$$n_m = (n_c \cdot n_p)^{1/2} \quad \text{Formula (7)}$$

It is more favorable for a thickness $t_m$ of the second anti-reflection film 145 to satisfy the following formula.

$$t_m = \lambda / (4 \cdot (n_c \cdot n_p)^{1/2}) \quad \text{Formula (8)}$$

In Formula (8), $\lambda$ is the wavelength of the light 211. The unit of the thickness $t_m$ is nanometers (nm).

For example, in the case where the refractive index $n_c$ of the solar cell 111 is 3.7 (silicon (Si)) and the refractive index $n_p$ of the concentrator 130 is 1.5, it is more favorable for the refractive index $n_m$ of the second anti-reflection film 145 to be about 2.35 (TiO$_2$, SrTiO$_3$, etc.). Or, in the case where, for example, the refractive index $n_c$ of the solar cell 111 is 3.7 (silicon (Si)) and, for example, the refractive index $n_p$ of the concentrator 130 using a reflection plate is 1, it is more favorable for the refractive index $n_m$ of the second anti-reflection film 145 to be about 1.9 (Si$_3$N$_4$, etc.).

Thereby, the reflections of the light 211 at the surface of the concentrator 130 are suppressed; and the light 211 can be guided efficiently toward the solar cell panel 110.

Figure 14:
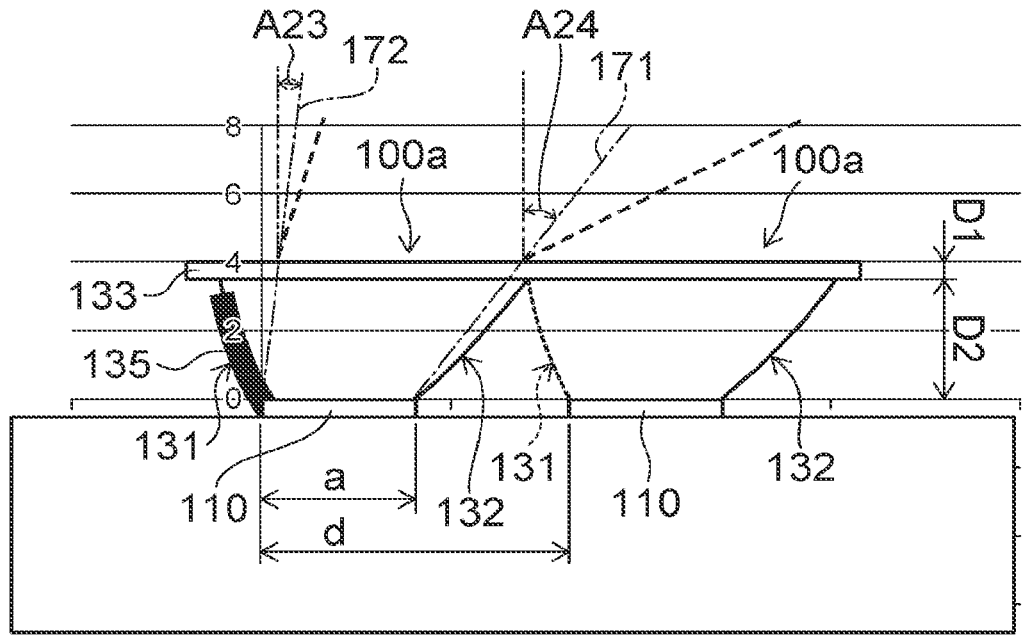
FIG. 14 is a schematic plan view showing an example of the solar cell module according to the embodiment.

FIG. 14 is a schematic plan view showing an example of the solar cell module according to the embodiment.

Two solar cell modules 100a are connected in the example shown in FIG. 14.

The minimum solar elevation A11 of the sun 210 is taken to be 30 degrees; and the maximum solar elevation A13 of the sun 210 is taken to be 80 degrees. In such a case, the incident angle of the light 211 of the sun 210 at the maximum solar elevation A13 is 10 degrees. The incident angle of the light 211 of the sun 210 at the minimum solar elevation A11 is 60 degrees.

The refractive index $n_p$ of the concentrator 130 is set to 1.493 (PMMA). Here, the light 211 is refracted when incident on the concentrator 130. Therefore, the substantial incident angle of the interior of the concentrator 130 is not less than 6.68 degrees and not more than 35.45 degrees. That is, a minimum substantial incident angle A23 shown in FIG. 14 is 6.68 degrees. A maximum substantial incident angle A24 shown in FIG. 14 is 35.45 degrees.

The width a of the solar cell 111 is set to 4 cm. The thickness D1 of the plate unit 133 of the concentrator 130 is set to 0.5 cm. The dimension D2 between the solar cell panel 110 and the lower portion of the plate unit 133 is set to 3.5 cm. In such a case, the ideal concentration ratio (d/a) is about 2.06.

The mirror coating 135 is provided on the first surface 131 of the solar cell module 100a on the left side of FIG. 14. In other words, in the example shown in FIG. 14, it is necessary to provide the mirror coating 135 on the first surface 131 of the solar cell module 100a on the left side; but it is unnecessary to provide the mirror coating 135 in the relatively wide region of the other parabolic surface.

The first surface 123 includes a third portion 123c and a fourth portion 123d. The second surface 124 includes a fifth portion 124e and a sixth portion 124f. The distance between the third portion 123c and the solar cell 111 is shorter than the distance between the fourth portion 123d and the solar cell 111. The distance between the fifth portion 124e and the solar cell 111 is shorter than the distance between the sixth portion 124f and the solar cell 111. A distance D12 between the fourth portion 123d and the sixth portion 124f is longer than a distance D11 between the third portion 123c and the fifth portion 124e.

The first surface 123 includes the third region F3. The second surface 124 includes a fourth region F4. The first light 211a that is incident on the first surface 123 undergoes total internal reflection in the third region F3. The second light 211b that is incident on the second surface 124 undergoes total internal reflection in the fourth region F4.

The solar cell module 100 according to the embodiment further includes a first mirror coating layer 135a and a second mirror coating layer 135b. The first surface 123 further includes the first region F1. The second surface 124 further includes the second region F2. The first mirror coating layer 135a is provided in the first region F1. The second mirror coating layer 135b is provided in the second region F2.

The solar cell module 100 according to the embodiment further includes the first reflection suppression film 143. The first light 211a passes through the first reflection suppression film 143 to be incident on the first surface 123. The second light 211b passes through the first reflection suppression film 143 to be incident on the second surface 124.

The refractive index of the first reflection suppression film 143 is lower than the refractive index of the concentrator 130.

The solar cell module 100 according to the embodiment further includes the second anti-reflection film 145. The second anti-reflection film 145 is provided between the first reflection suppression film 143 and the solar cell panel 110. The first light 211a passes through the second reflection suppression film 145 to be incident on the first portion 113. The second light 211b passes through the second reflection suppression film 145 to be incident on the second portion 114.

The refractive index of the second reflection suppression film 145 is higher than the refractive index of the concentrator 130 and lower than the refractive index of the solar cell 111.

One of the first mirror coating layer 135a or the second mirror coating layer 135b includes one of silver or aluminum.

Figure 15:
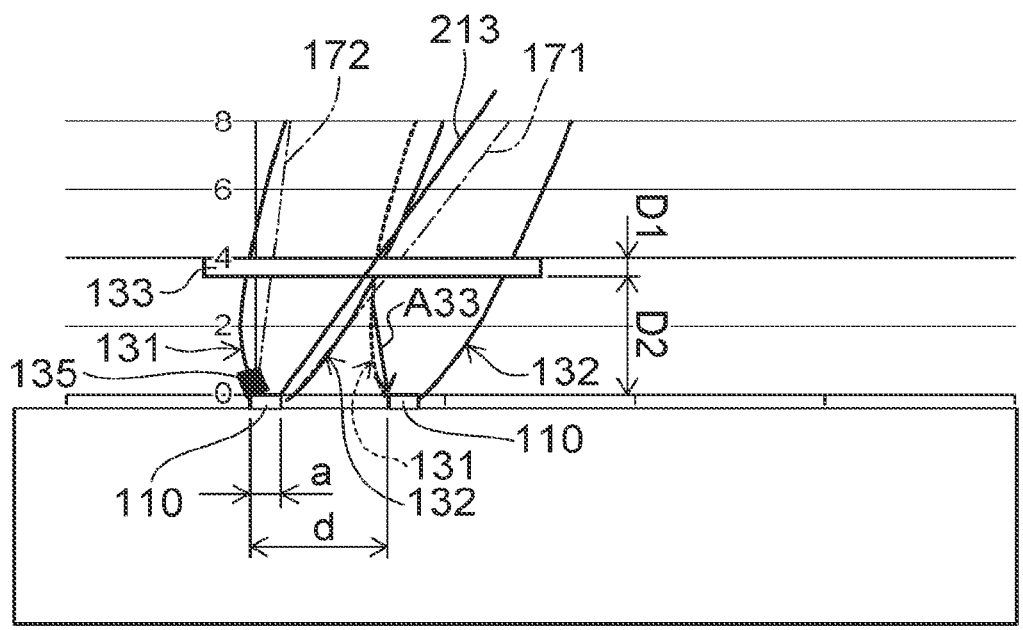
FIG. 15 is a schematic plan view showing another example of the solar cell module according to the embodiment.

FIG. 15 is a schematic plan view showing another example of the solar cell module according to the embodiment.

In the example shown in FIG. 15, the width a of the solar cell 111 of the solar cell module 100a shown in FIG. 14 is set to 1 cm. Thereby, the first axis 171 intersects the second surface 132 in the solar cell module 100a on the left side as shown in FIG. 15. The first axis 171 corresponds to the y-axis of the first surface 131. Otherwise, the structure is the same as the structure of the solar cell module 100a described above in regard to FIG. 14.

As described above in regard to FIG. 4A to FIG. 4D, the first axis 171 is parallel to the travel direction of the light 211 of the sun 210 at the minimum solar elevation A11. The second axis 172 is parallel to the travel direction of the light 211 of the sun 210 at the maximum solar elevation A13. Therefore, the light 211 of the sun 210 travels in the area between the first axis 171 and the second axis 172 toward the concentrator 130.

However, the light 211 of the sun 210 of a prescribed elevation from the minimum solar elevation A11 (e.g., the light 211 substantially parallel to the first axis 171) is shielded by the second surface 132 of the solar cell module 100a on the left side. Therefore, the light of the sun 210 of an elevation relatively proximal to the minimum solar elevation A11 that can be incident on the concentrator 130 is light 213 shown in FIG. 15.

Even in such a case, the mirror coating 135 is provided on the first surface 131 of the solar cell module 100a on the left side. As illustrated by arrow A33 shown in FIG. 15, the light 211 that is incident on the concentrator 130 and reaches the first surface 131 of the solar cell module 100a on the right side undergoes total internal reflection at the first surface 131. In the example shown in FIG. 15, the ideal concentration ratio (d/a) is about 3.4.

Figure 16:
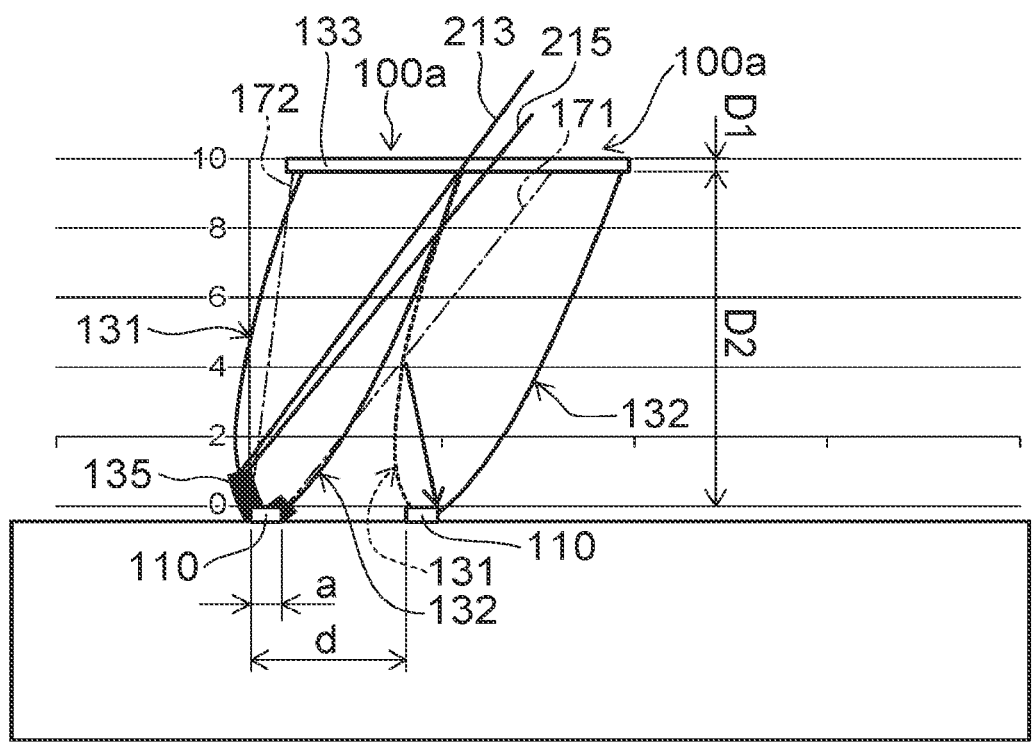
FIG. 16 is a schematic plan view showing still another example of the solar cell module according to the embodiment.

FIG. 16 is a schematic plan view showing another example of the solar cell module according to the embodiment.

In the example shown in FIG. 16, the height of the plate unit 133 of the concentrator 130 of the solar cell module 100a shown in FIG. 15 is set to be high. That is, the dimension D2 between the solar cell panel 110 and the lower portion of the plate unit 133 is longer than 3.5 cm.

In such a case, light 215 of the maximum incident angle may not be able to reach the region where the mirror coating 135 is provided. The light 215 of the maximum incident angle is parallel to the first axis 171. In other words, the light 215 of the maximum incident angle is the light of the sun 210 at the minimum solar elevation A11. Therefore, in the example shown in FIG. 16, it is necessary to redesign the solar cell module 100a to match the light 213 of the sun 210 of an elevation relatively proximal to the minimum solar elevation A11 that can reach the region where the mirror coating 135 is provided. In the example shown in FIG. 16, the ideal concentration ratio (d/a) is about 4.1.

Figure 17A:
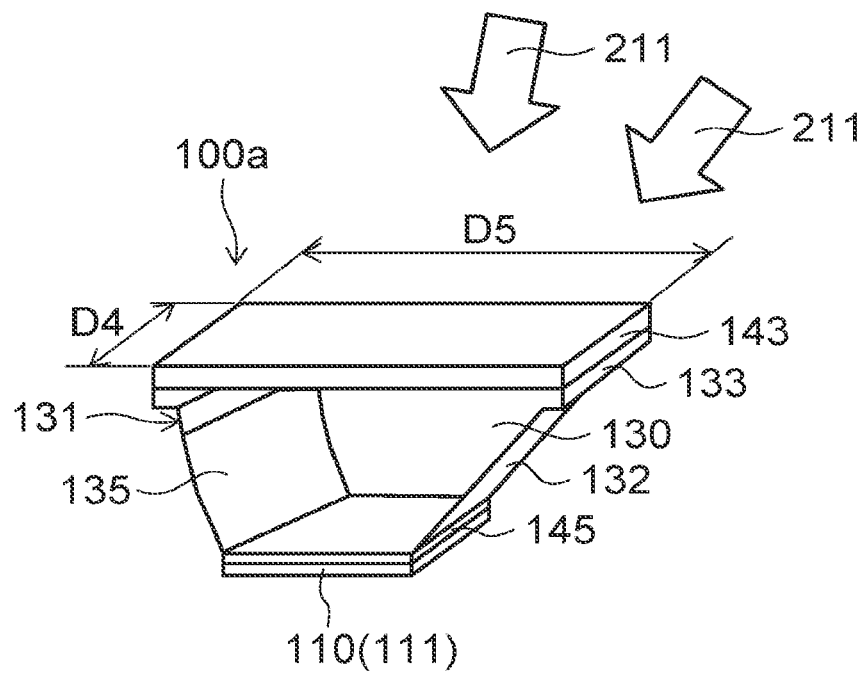
FIGS. 17A and 17B are schematic views showing still another example of the solar cell module according to the embodiment.
Figure 17B:
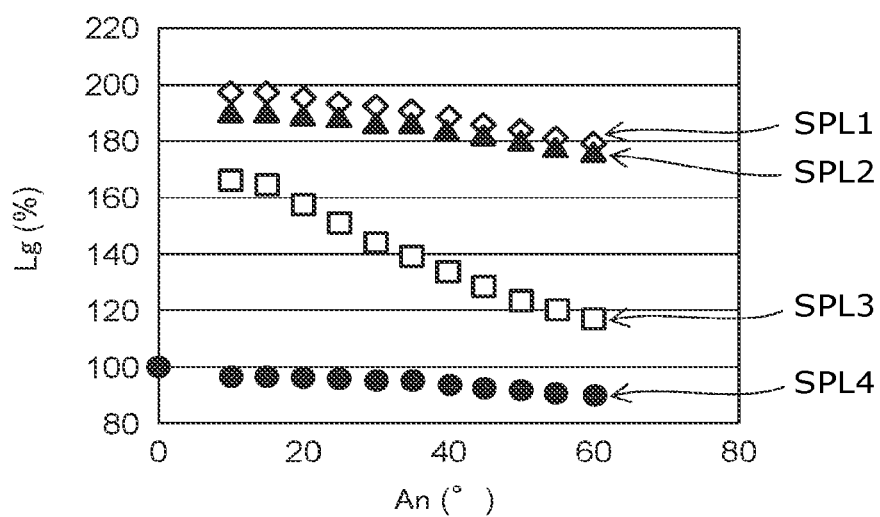

FIGS. 17A and 17B are schematic views showing another example of the solar cell module according to the embodiment.

FIG. 17A is a schematic plan view showing another example of the solar cell module according to the embodiment. FIG. 17B is a graph of an example of the relationship between an incident angle An and a light amount Lg. In the graph shown in FIG. 17B, the light amount Lg is taken to be 100% when the incident angle An is 0 degrees for no light concentration (the case where the concentrator 130 is not provided). In FIG. 17B, data SPL1 correspond to "partial vapor-deposition". Data SPL2 correspond to "entire vapor-deposition". Data SPL3 correspond to "without partial vapor-deposition". Data SPL4 correspond to "no light concentration".

The solar cell module 100a shown in FIG. 17A includes the solar cell panel 110, the concentrator 130, the first anti-reflection film 143, and the second anti-reflection film 145. The structure of the solar cell module 100a shown in FIG. 17A is similar to the structure of the solar cell module 100a described above in regard to FIG. 13A.

The first anti-reflection film 143 is provided on the upper surface of the plate unit 133 of the concentrator 130. The material of the first anti-reflection film 143 is $MgF_2$. The first anti-reflection film 143 has a rectangular configuration. A length D4 of one side of the first anti-reflection film 143 is 4 cm. A length D5 of another side of the first anti-reflection film 143 intersecting the one side is 8.3 cm. The thickness of the first anti-reflection film 143 is 100 nm.

The second anti-reflection film 145 is provided between the concentrator 130 and the solar cell panel 110. The material of the second anti-reflection film 145 is $TiO_2$. The thickness of the second anti-reflection film 145 is 60 nm.

As the mirror coating 135, a portion in which aluminum is vapor-deposited is provided in the first surface 131. In the example, the relationship between the incident angle An and the light amount Lg is investigated for the case where the aluminum is vapor-deposited on the entire first surface 131, the case where the aluminum is vapor-deposited on a portion of the first surface 131, and the case where the aluminum is not vapor-deposited on the first surface 131. Similarly, the case where the concentrator 130 is not provided is investigated.

The solar cell 111 has a square configuration. The length of one side of the solar cell 111 is 4 cm.

The ideal concentration ratio of the solar cell module 100a shown in FIG. 17A is 2.06.

The investigation results are as shown in FIG. 17B.

In other words, the light amount Lg is higher for the case where the concentrator 130 is provided than for the case where the concentrator 130 is not provided.

In the case where the aluminum is vapor-deposited on the entire first surface 131, the total internal reflection of the light cannot be utilized; and reflection loss occurs. Therefore, the light amount Lg is lower for the case where the aluminum is vapor-deposited on the entire first surface 131 than for the case where the aluminum is vapor-deposited on a portion of the first surface 131. However, the light amount Lg of the case where the aluminum is vapor-deposited on the entire first surface 131 is higher than the light amount Lg of the case where the aluminum is not vapor-deposited on the first surface 131. In the embodiment, the case where the aluminum is vapor-deposited on the entire first surface 131 is not eliminated.

Even in the case where the aluminum is not vapor-deposited on the first surface 131, there is a light concentration effect when the concentrator 130 is provided.

Embodiments include following Clauses:

Clause 1

A solar cell module, comprising:
 a solar cell panel having a first cell surface including a first portion and a second portion; and
 a concentrator,
 the concentrator having
  a first surface, and
  a second surface separated from the first surface,
 a first light incident on the first surface at a first incident angle being incident on the first portion,
 a second light incident on the second surface at a second incident angle being incident on the second portion,
 the first surface including a first parabola where the first surface intersects a first perpendicular plane, the first perpendicular plane including a direction from the first portion toward the second portion, the first perpendicular plane being perpendicular to the first cell surface,
 the second surface including a second parabola where the second surface intersects the first perpendicular plane,
 a first point on the first parabola and a second point on the second parabola being asymmetric with respect to a second perpendicular plane, the second perpendicular plane being perpendicular to the first cell surface and the first perpendicular plane.

Clause 2

The module according to Clause 1, wherein
 the first portion includes a first focal point of the first parabola, and
 the second portion includes a second focal point of the second parabola.

Clause 3

The module according to Clause 1, wherein
 the solar cell panel includes a first edge portion and a second edge portion, the first edge portion includes the first focal point of the first parabola, and
the second edge portion includes the second focal point of the second parabola.

Clause 4
The module according to Clause 1, wherein
the first surface has a first concave surface,
the second surface has a second concave surface, and
the first concave surface opposes the second concave surface.

Clause 5
The module according to Clause 1, wherein
the first incident angle is a one-year maximum value of an angle between sunlight and a direction perpendicular to a ground surface, and
the second incident angle is a one-year minimum value of the angle between the sunlight and the direction perpendicular to the ground surface.

Clause 6
The module according to Clause 1, wherein the concentrator includes:
a first light concentration plate having the first surface; and
a second light concentration plate having the second surface.

Clause 7
The I module according to Clause 1, wherein
the first surface includes a third portion and a fourth portion,
the second surface includes a fifth portion and a sixth portion,
a distance between the third portion and the solar cell is shorter than a distance between the fourth portion and the solar cell,
a distance between the fifth portion and the solar cell is shorter than a distance between the sixth portion and the solar cell, and
a distance between the fourth portion and the sixth portion is longer than a distance between the third portion and the fifth portion.

Clause 8
The module according to Clause 7, wherein
the concentrator includes a light concentrating material, and
a refractive index of the concentrator is higher than a refractive index of ambient air.

Clause 9
The module according to Clause 8, wherein
the first surface includes a third region,
the second surface includes a fourth region,
the first light incident on the first surface undergoes total internal reflection in the third region, and
the second light incident on the second surface undergoes total internal reflection in the fourth region.

Clause 10
The module according to Clause 9, further comprising:
a first mirror coating layer; and
a second mirror coating layer,
the first surface further including a first region,
the second surface further including a second region,
the first mirror coating layer being provided in the first region,
the second mirror coating layer being provided in the second region.

Clause 11
The module according to Clause 8, further comprising a first reflection suppression film,
the first light passing through the first reflection suppression film to be incident on the first surface,
the second light passing through the first reflection suppression film to be incident on the second surface.

Clause 12
The module according to Clause 11, wherein a refractive index of the first reflection suppression film is lower than the refractive index of the concentrator.

Clause 13
The module according to Clause 12, further comprising a second reflection suppression film provided between the first reflection suppression film and the solar cell panel,
the first light passing through the second reflection suppression film to be incident on the first portion,
the second light passing through the second reflection suppression film to be incident on the second portion.

Clause 14
The module according to Clause 13, wherein a refractive index of the second reflection suppression film is higher than the refractive index of the concentrator and lower than a refractive index of the solar cell.

Clause 15
The module according to Clause 8, wherein the concentrator includes a polymethylmethacrylate resin.

Clause 16
The module according to Clause 10, wherein one of the first mirror coating layer or the second mirror coating layer includes one of silver or aluminum.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A solar cell module, comprising:
a solar cell panel including a solar cell; and
a concentrator reflecting light incident from the outside and irradiating the light onto the solar cell,
the concentrator having
a first surface reflecting light incident at a first incident angle and irradiating the light incident at the first incident angle onto a first portion within the area of the solar cell, and
a second surface reflecting light incident at a second incident angle and irradiating the light incident at the second incident angle onto a second portion within the area of the solar cell, the second incident angle being different from the first incident angle, the second portion being different from the first portion,
the first surface and the second surface being asymmetric as viewed from the solar cell,
wherein the solar cell panel is located at an opposite back side of the concentrator to an incident side of the concentrator, the incident side being an entire front surface of the concentrator that receives incident light.

2. The solar cell module according to claim 1, wherein
the first surface is different from the second surface,
the first portion is a focal point of the first surface, and
the second portion is a focal point of the second surface.

3. The solar cell module according to claim 2, wherein
the focal point of the first surface is positioned at a first edge portion of the solar cell, and
the focal point of the second surface is positioned at a second edge portion of the solar cell, the second edge portion being different from the first edge portion.

4. The solar cell module according to claim 1, wherein a concave surface of the first surface opposes a concave surface of the second surface.

5. The solar cell module according to claim 1, wherein
the first incident angle is the maximum incident angle of sunlight for a time period of one year, and
the second incident angle is the minimum incident angle of sunlight for a time period of one year.

6. The solar cell module according to claim 1, wherein the concentrator includes:
a first light concentration plate, the first surface being formed of the first light concentration plate; and
a second light concentration plate, the second surface being formed of the second light concentration plate.

7. The solar cell module according to claim 1, wherein the concentrator has a convex configuration on the solar cell panel side, and the concentrator includes a material having a refractive index higher than a refractive index of ambient air.

8. The solar cell module according to claim 7, wherein
the light incident at the first incident angle undergoes total internal reflection for at least a portion of the first surface, and
the light incident at the second incident angle undergoes total internal reflection for at least a portion of the second surface.

9. The solar cell module according to claim 8, wherein
a mirror coating is provided on the first surface other than at least a portion of the first surface, and
a mirror coating is provided on the second surface other than at least a portion of the second surface.

10. The solar cell module according to claim 7, further comprising a first anti-reflection film provided on a side opposite to the solar cell panel as viewed from the concentrator, the first anti-reflection film having a refractive index lower than the refractive index of the concentrator and higher than the refractive index of the ambient air.

11. The solar cell module according to claim 10, further comprising a second anti-reflection film provided between the concentrator and the solar cell panel, the second anti-reflection film having a refractive index between the refractive index of the concentrator and the refractive index of the solar cell.

12. The solar cell module according to claim 7, wherein the concentrator includes a polymethylmethacrylate resin.

13. The solar cell module according to claim 1, wherein
the concentrator includes a first light concentration plate and a second light concentration plate, the first light concentration plate has the first surface, the second light concentration plate has the second surface,
the solar cell panel is provided between the first light concentration plate and the second light concentration plate.

14. The solar cell module according to claim 1, wherein a light not incident on the concentrator is incident on the solar cell panel.

* * * * *